United States Patent [19]

Freundlich

[11] Patent Number: 4,500,603
[45] Date of Patent: Feb. 19, 1985

[54] ELECTRICAL GRADE EXTRUDED FILLED THERMOPLASTIC SHEET MATERIAL AND PROCESS FOR THE MANUFACTURE THEREOF

[75] Inventor: Richard A. Freundlich, Summit, N.J.

[73] Assignee: Celanese Corporation, N.Y.

[21] Appl. No.: 230,918

[22] Filed: Feb. 2, 1981

Related U.S. Application Data

[63] Continuation of Ser. No. 63,003, Aug. 2, 1979, abandoned.

[51] Int. Cl.$^3$ .................. B32B 17/04; B32B 5/08
[52] U.S. Cl. ............................ 428/409; 428/141; 428/294; 428/297; 428/413; 428/417; 428/422; 428/426; 428/430; 428/435; 428/441; 428/480
[58] Field of Search ............... 428/409, 430, 480, 294, 428/413, 426, 435, 422, 141, 920, 921, 297, 417, 441; 260/40 R

[56] References Cited

U.S. PATENT DOCUMENTS

| | | | |
|---|---|---|---|
| 2,950,502 | 8/1960 | Weaver | 264/175 |
| 3,074,114 | 1/1963 | Petry | 264/175 |
| 3,931,094 | 1/1976 | Segal | 260/37 N |
| 3,953,394 | 4/1976 | Fox | 260/40 R |
| 4,015,039 | 3/1977 | Segal | 428/430 |
| 4,024,102 | 5/1977 | Stackman | 260/40 R |
| 4,123,415 | 10/1978 | Wambach | 260/40 R |

FOREIGN PATENT DOCUMENTS

| | | |
|---|---|---|
| 776986 | 6/1957 | United Kingdom . |
| 888840 | 2/1962 | United Kingdom . |
| 1068064 | 5/1967 | United Kingdom . |
| 1074699 | 7/1967 | United Kingdom . |
| 1243108 | 8/1971 | United Kingdom . |
| 1452323 | 10/1976 | United Kingdom . |

Primary Examiner—Ellis P. Robinson
Attorney, Agent, or Firm—Andrew F. Sayko, Jr.

[57] ABSTRACT

Disclosed is a novel filled continuous thermoplastic sheet material highly suitable for use in electrical applications, such as in the production of printed circuit boards. This material comprises an extruded sheet of a thermoplastic polymer, preferably poly(1,4-butylene terephthalate), containing from about 5 to 60% by weight of reinforcing filler material such as glass fibers, and having a polymer-rich surface, a gloss value of at least 15, and a maximum roughness of about 150 microinches. Also disclosed is a process and apparatus for the production of this material by extruding a filled thermoplastic polymer into a continuous laminar melt stream, conveying the laminar melt stream to a hot, highly polished surface, and then contacting the resulting melt stream with the hot, highly polished surface under temperature and pressure conditions sufficient to cause the filler material to retreat from the surface of the melt stream and to produce a sheet material having a smooth, glossy, polymer-rich surface thereon.

15 Claims, 10 Drawing Figures

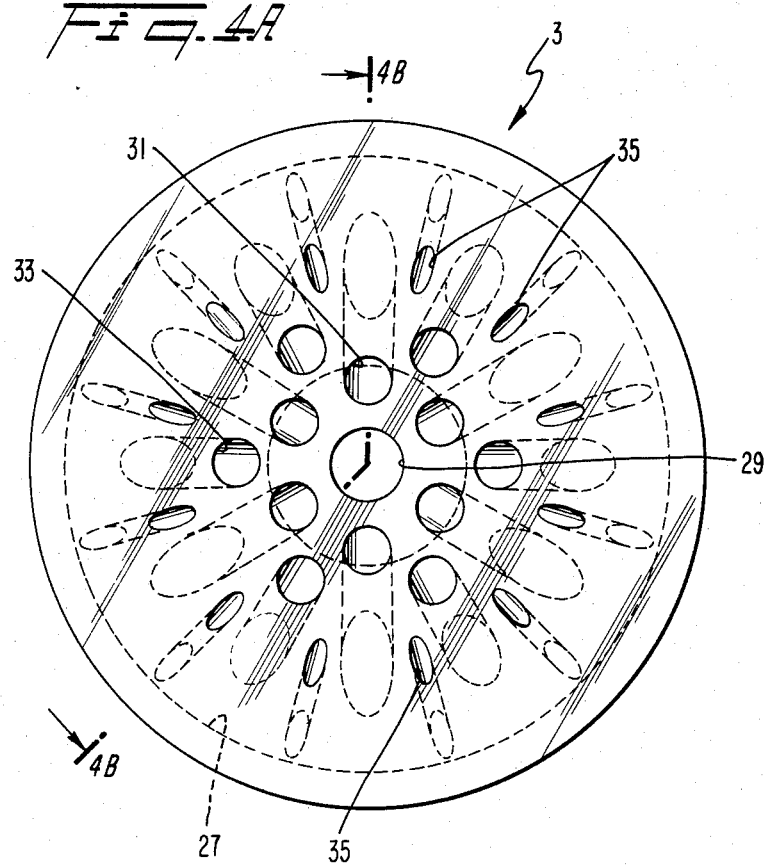
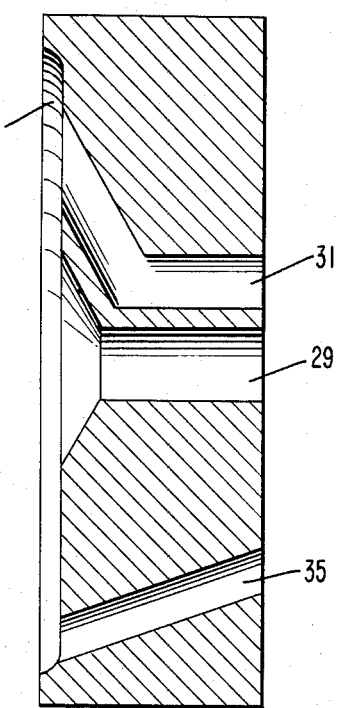
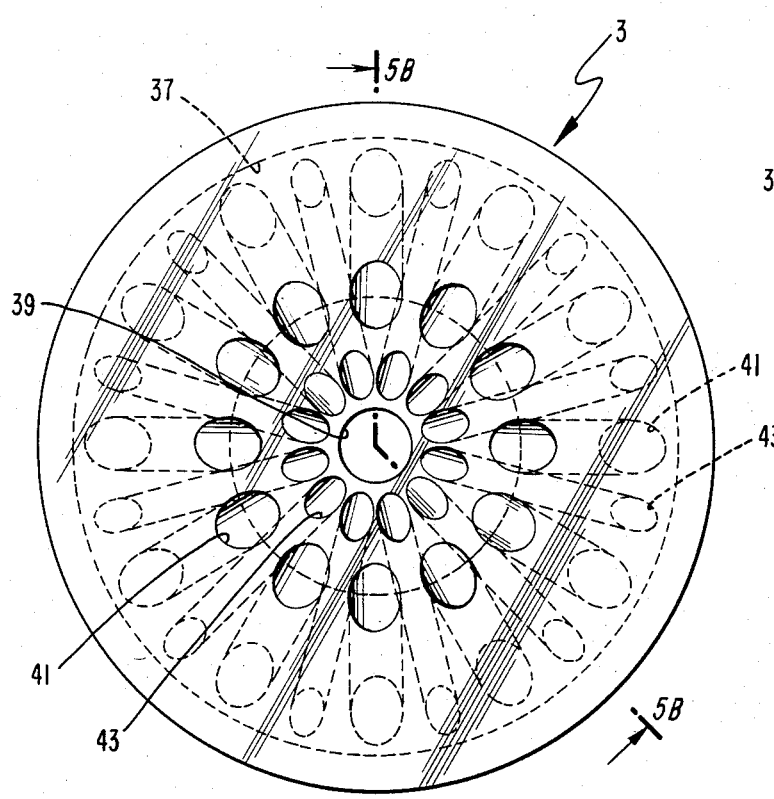
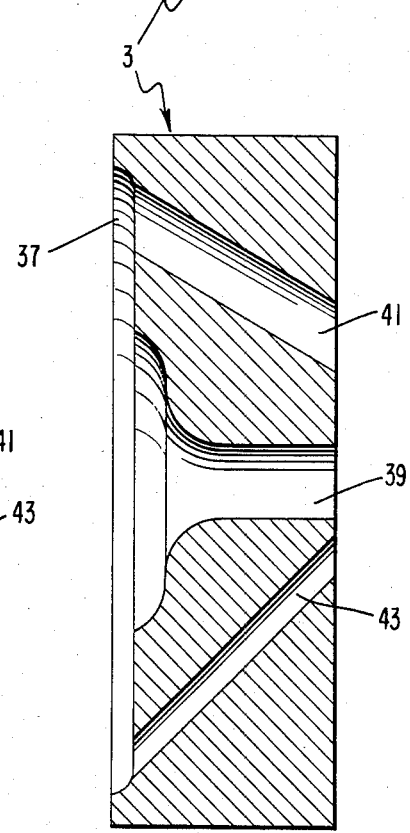

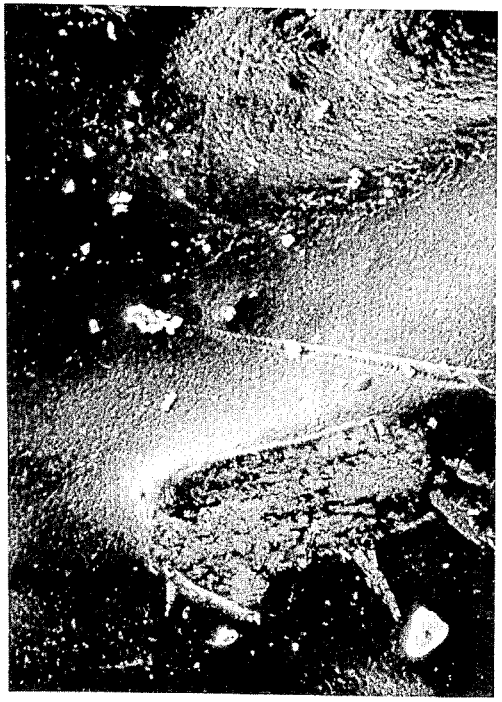
FIG. 6
FIG. 7
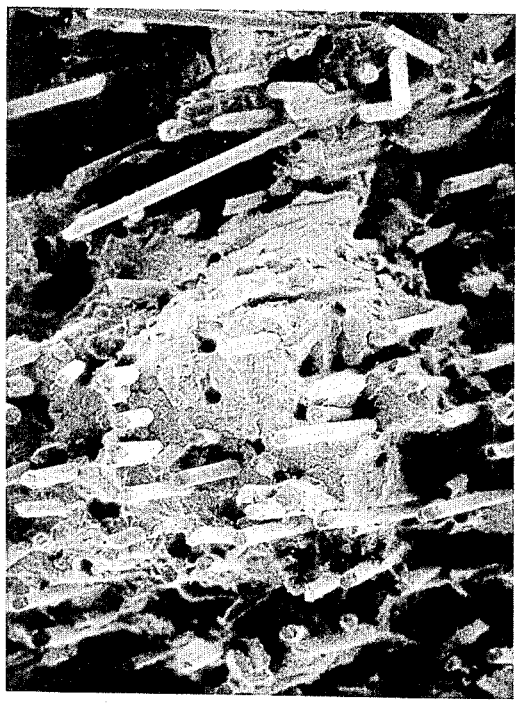

ELECTRICAL GRADE EXTRUDED FILLED THERMOPLASTIC SHEET MATERIAL AND PROCESS FOR THE MANUFACTURE THEREOF

This is a continuation of application Ser. No. 63,003, filed Aug. 2, 1979, now abandoned.

BACKGROUND OF THE INVENTION

The present invention relates to a novel extruded continuous thermoplastic sheet material having a unique combination of physical properties and surface appearance highly suitable for use in electrical applications, such as in the production of printed circuit boards. The present invention particularly relates to an extruded polyalkylene terephthalate sheet material having a combination of physical properties and surface appearance suitable for use in the manufacture of circuit boards and in other electrical applications. The instant invention also relates to a process and apparatus for use in the manufacture of the aforementioned extruded sheet materials.

As used herein, the term "sheet material" is used in a generic sense, and includes both sheet and film.

Conventionally, printed circuit boards are manufactured from laminated sheets of thermoset phenolic polymers and epoxy-glass systems. The laminated phenolic sheets are die cut into an electrical component having a desired size and shape, called a substrate. An electrical circuit is then applied to the substrate. Due to the very intricate shapes which these substrates must possess, a large amount of scrap in produced. While phenol laminates and epoxy-glass systems possess the necessary combination of physical properties and surface appearance essential for use in electrical components such as circuit boards, phenol laminates and epoxy-glass systems are not reprocessable due to their thermoset nature. The use of these materials in the manufacture of circuit boards has thus been accompanied by an undesirably large volume of costly unusable scrap.

One approach to this problem has been to injection mold circuit board substrates from filled thermoplastic polymers. As is well known to those skilled in the art, a large number of the filled thermoplastic polymers, and particularly the glass-filled polyesters, and polyamides, possess the necessary combination of heat resistance, heat distortion temperature, flexural modulus, and flammability necessary for use in high temperature applications, such as electrical applications. The large expense and complexity associated with injection molding, however, has rendered injection molded substrates even less desirable for use in circuit boards than stamped phenol laminates.

It has also been suggested that circuit boards be manufactured from extruded sheets of filled thermoplastic polymers. Extrusion has the advantage of being a continuous and relatively inexpensive process for producing filled thermoplastic sheet materials. Heretofore, however, the prior art has been unable to develop an extruded sheet of filled thermoplastic polymer suitable for this purpose. A particularly glaring deficiency of prior art extruded sheet of filled and particularly glass-filled thermoplastic polymer has been that this material has possessed a very rough and uneven surface which has severely limited its commercial use, and particularly its use in circuit boards and other electrical components.

This inability of the prior art to develop a satisfactory extruded sheet of filled thermoplastic material has been particularly pronounced with respect to filled polyalkylene terephthalate compositions, and especially glass-filled polybutylene terephthalate compositions. As is well known to those skilled in the art, glass-filled polybutylene terephthalate compositions, such as those described in U.S. Pat. Nos. 3,764,576; 3,801,530; 3,873,491; 3,814,725; 3,903,042; 4,052,356; 4,123,415; and 4,124,561, possess a unique combination of physical properties which render these compositions ideally suited for use as circuit board substrates and in other electrical applications. While U.S. Pat. Nos. 3,742,087 and 3,580,964 suggest that filled polybutylene terephthalate compositions may be extruded into sheet materials, prior art attempts to produce such a material have resulted in a low melt strength, commercially unacceptable material having a very rough, roller-coaster surface. Prior art attempts to produce an extruded polybutylene terephthalate sheet material have been so unsuccessful in fact that an extruded glass-reinforced polybutylene terephthalate sheet material is presently unavailable on the market, despite a very great demand for such a material.

Another approach to the problem of producing a filled thermoplastic sheet material is disclosed in U.S. Pat. Nos. 2,950,502 and 3,074,114. In each of these patents, a filled thermoplastic sheet material is formed by calendering a plasticized admixture of filler material and thermoplastic polymer into a sheet and then polishing the resulting sheet with heated rolls. In U.S. Pat. No. 2,950,502, a layer of a silicone compound is employed to prevent sticking of the sheet to the polishing roll. Such processes are undesirable for use in the production of glass-filled sheet materials, however, since the use of calendering to form a sheet from the admixture of thermoplastic polymer and glass fiber, in contrast to extrusion, results in a substantial amount of undesirable glass fiber breakage. Moreover, the process of U.S. Pat. No. 3,074,114 is unsuitable for use with polymers that require drying, and employs such a high roll speed that a good surface appearance cannot be obtained. Each of these patents is basically concerned with producing wear surfaces for flooring having good color and pattern differentiation, and is not directed to producing filled thermoplastic sheets suitable for electrical uses.

U.S. Pat. No. 2,061,042 also discloses that a non-filled cellulose ester sheet material having a more uniform thickness may be formed by interposing a breaker plate between the screw and sheet die of an extrusion apparatus to create a pressure drop in the flow of cellulose ester and to develop a more uniform die pressure. The prior art has yet to develop, however, a suitable process for producing extruded, filled thermoplastic sheet materials.

Accordingly, there exists a great need in the art to develop an extruded thermoplastic sheet material suitable for use in electrical applications, as well as a process suitable for the production of such material.

SUMMARY OF THE INVENTION

Accordingly, it is an object of the present invention to provide a novel continuous, extruded, thermoplastic sheet material suitable for use in electrical applications.

A further object of the present invention is to provide a novel extruded sheet material comprised of a crystalline thermoplastic polymer which is suitable for use in electrical applications.

A particular object of the present invention is to provide a novel extruded polyalkylene terephthalate sheet material suitable for use in electrical applications.

Yet another object of the instant invention is to provide a process and apparatus for preparing each of the aforementioned sheet materials.

In accomplishing the foregoing and other objects, there has been provided in accordance with the present invention a novel extruded thermoplastic sheet material suitable for use in electrical applications, as well as other applications where a filled material having a good surface appearance is desired. This material comprises an extruded sheet material of a thermoplastic polymer, containing from about 5 to 60% by weight of a reinforcing filler material, having a polymer-rich surface, and having further a gloss value of at least 15 and surface roughness of less than about 150 microinches.

In a second aspect, the present invention also provides a process for preparing the aforementioned sheet material. This process comprises melt extruding a thermoplastic polymeric material containing from about 5 to 60% by weight of a reinforcing filler material into a continuous laminar melt stream, conveying said laminar melt stream to a hot, highly polished surface, and then contacting the melt stream with the hot, highly polished surface at a temperature of from about 200° F. up about the temperature at which the thermoplastic polymer sticks to the hot, highly polished surface and at a pressure sufficient to cause the filler material to retreat from the surface of the melt stream and to produce a continuous filled thermoplastic sheet material having a smooth, glossy, polymer-rich surface.

In other embodiments of the instant invention, further improvements in surface appearance are obtained by extruding the filled thermoplastic polymer under conditions such that the stream of thermoplastic polymer has a substantially oriented flow in the direction of extrusion and a reduced axial-rotational flow at its point of entry into the sheet die. Sheet quality may be further improved by utilizing a pressure roll system defining a nip therebetween as the hot, highly polished surface, and then passing the filled thermoplastic polymer through the nip under conditions such that a melt reservoir of filled thermoplastic polymer is maintained upstream from the nip but in the approximate location thereof.

Also provided in accordance with the present invention is an apparatus for use in the instant process. This apparatus comprises a screw extruder; a sheet die; means interposed between the screw extruder and the sheet die which converts the flow of thermoplastic material from a cork screw-like flow to a substantially oriented laminar flow; and a heated, highly polished pressure roll system.

In a further embodiment, the present invention also provides a breaker plate for use in the extrusion of filled thermoplastic sheet materials. This breaker plate comprises a rigid plate having a plurality of spaced ports extending therethrough which gradually converge the flow of thermoplastic polymer passing through the plate and align the filler material therein.

Through the use of the inventive concepts of the present invention, a novel extruded thermoplastic sheet material having the physical properties of a filled sheet material, and a surface appearance almost as good as that of a non-filled sheet material may be obtained. Moreover, the novel sheet materials of the present invention also exhibit an improved dielectric strength as compared with molded specimens of the same thickness and are thus highly suitable for use in electrical applications.

The instant sheet material may be comprised of any of those thermoplastic materials well known to those skilled in the art from which sheet materials are conventionally made. A particularly advantageous use of the present invention is in the production of novel, high quality, extruded sheet materials from crystalline thermoplastic polymers such as the polyalkylene terephthalates and polyamides which have heretofore been extruded only with great difficulty. As a commercially acceptable extruded polyalkylene terephthalate sheet material, and especially a polybutylene terephthalate sheet material, is highly desirable due to its unique combination of physical properties, the present invention thus provides, in a further preferred aspect thereof, a novel filled polyalkylene terephthalate sheet material and a process for the preparation thereof. This material comprises an extruded sheet containing from about 5 to 60% by weight of a reinforcing filler material of a polyalkylene terephthalate polymer selected from the group consisting of polyalkylene terephthalate homopolymers and copolymers, such as polybutylene terephthalate, mixtures thereof, and mixtures thereof with minor amounts of other thermoplastic polymers, having a polymer-rich surface, a gloss value of at least 15, and a surface roughness of less than about 150 microinches.

Other objects, features, and advantages of the present invention will become apparent to those skilled in the art from the following detailed description of the present invention, taken in conjunction with the accompanying figures of drawing wherein:

BRIEF DESCRIPTION OF THE DRAWINGS

FIG. 4A is an enlarged end view of a second embodiment of breaker plate.

FIG. 4B is a sectional view along line 3B of the breaker plate of FIG. 4A.

FIG. 5A is an enlarged sectional view of another embodiment of the breaker plate employed in the apparatus of FIG. 1.

FIG. 5B is a sectional view along line 4B of the breaker plate of FIG. 5A.

FIG. 6 is a photograph of an extruded sheet of glass-filled poly(1,4-butylene terephthalate) shown at a magnification of 500×, illustrating the polymer-rich surface of the sheet material of the present invention.

FIG. 7 is a photograph of a vertical section along a plane normal to the direction of extrusion of the extruded sheet of FIG. 5 following fracture to expose the glass fibers, shown at a magnification of 200×.

DETAILED DESCRIPTION OF THE PREFERRED EMBODIMENTS

Figure 1:
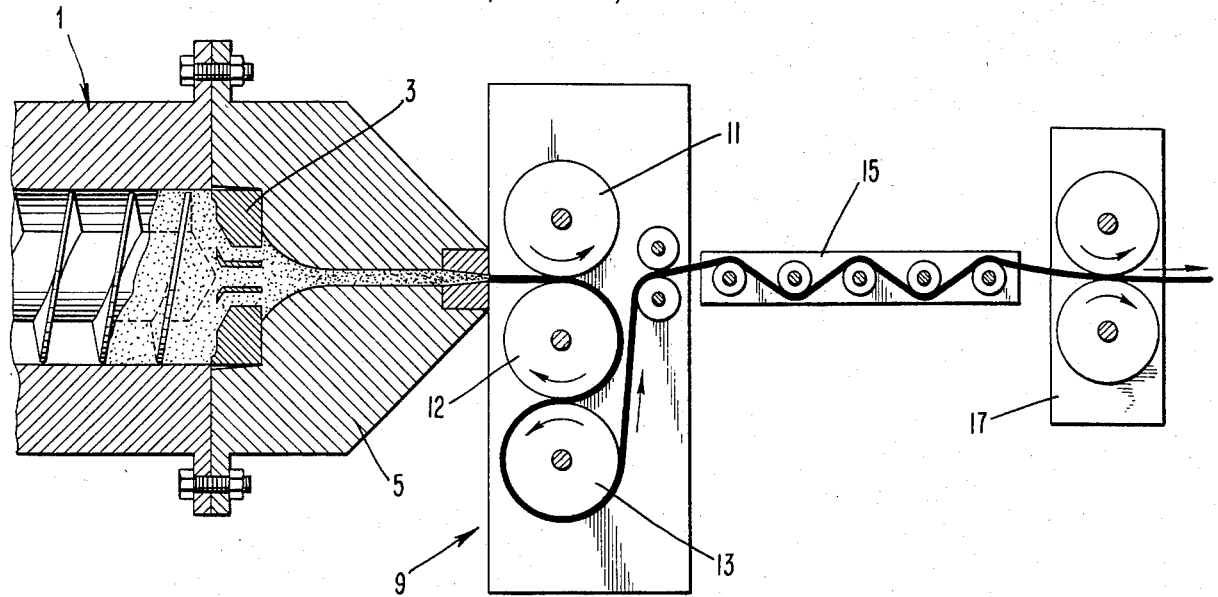
FIG. 1 is a sectional view of the apparatus and process of the present invention.

The present invention is premised upon the discovery that contacting an extruded, filled thermoplastic sheet material with a highly polished surface under pressure and at high temperatures causes the filler material to migrate into the interior of the sheet, producing a smooth, glossy, polymer-rich surface thereon. By extruding a filled thermoplastic polymer into a sheet and then contacting the sheet with a highly polished surface under temperature and pressure conditions sufficient to produce a polymer-rich surface thereon, a novel extruded sheet material having the physical properties of a filled sheet material, and a surface appearance almost as good as a non-filled sheet material may be obtained. Moreover, as a result of its polymer-rich surface, the instant extruded sheet materials possess an improved dielectric strength as compared with conventional filled sheet materials having a non-polymer rich surface, a feature which is highly desirable in electrical end-uses.

In addition to causing the filler material to migrate from the sheet surface, the heat and pressure applied to the sheet material during the contacting step also appears to assist the thermoplastic polymer to set up into a stable sheet. This feature is particularly advantageous in the production of stable sheet materials from the difficulty extrudable low-melt strength crystalline thermoplastic polymers such as polybutylene terephthalate, enabling a stable, non-soupy sheet material comprised of this polymer to be produced for the first time.

The novel extruded, filled thermoplastic sheet materials of the instant invention may be comprised of any of those thermoplastic polymers well known to those skilled in the art from which sheet materials have conventionally been made. Examples of suitable thermoplastic polymers include polyolefins such as polyethylene, polypropylene, and copolymers thereof, polyphenylene oxide polymers and copolymers, styrene polymers and copolymers such as polystyrene, styrene-acrylonitrile polymers, styrene-butadiene-acrylonitrile copolymers, polyarylether polymers and copolymers, polycarbonate polymers, polyurethane polymers and copolymers, vinyl halide polymers and copolymers such as vinyl chloride, polytetrafluoroethylene, and acrylic polymers and copolymers such as polymethylmethacrylate.

As has been described above, the novel filled sheet materials of the present invention may also be comprised of thermoplastic polymers which have heretofore been difficult to extrude into sheet materials, such as the low melt strength polyester, polyamide, and polyoxymethylene polymers and copolymers. In fact, the present invention provides for the first time, as will be described more fully hereinafter, a commercially acceptable extruded polybutylene terephthalate sheet material. Examples of other such low melt strength thermoplastic polymers of which the novel sheet materials of the instant invention may be comprised include polyamides such as polycaprolactam, polyhexamethylene adipamide, polyhexamethylene sebacimide, polyhexamethylene laurinamide, poly(1,2-aminolauric acid), and poly(1,1-aminoundecanoic acid); polyesters such as polybutylene terephthalate and its copolyesters, polyethylene terephthalate, glycol modified polyethylene terephthalates, poly(1,4-cyclohexamethylene terephthalate) and its glycol modified copolyesters, poly(butylene tetramethylene ether terephthalate) and halogenated polyesters such as ethoxylated tetrabromo bisphenol A modified polybutylene terephthalate; and polyoxymethylene polymers such as polyoxymethylene itself and various acetal copolymers such as are described in Walling et al, U.S. Pat. No. 3,027,352, the entirety of which is herein incorporated by reference. The sheet materials of the present invention may also be comprised of branched polyesters such as branched polybutylene terephthalate polyesters based on pentaerythritol. Branched polybutylene terephthalate polymers and their preparation are described in U.S. Pat. No. 3,953,404, the entirety of which is herein incorporated by reference. Mixtures of any of the foregoing polymers, with each other (such as for example blends of polyethylene terephthalate with polybutylene terephthalate), or with other thermoplastic polymers (such as for example blends of polyalkylene terephthalate with polycarbonates) may also be employed.

The instant sheet materials will also contain from about 5 to 60%, preferably 20 to 45%, by weight of a reinforcing filler material. As used herein, the term "reinforcing filler material" means a non-continuous filler material. Examples of suitable reinforcing fillers include glass fibers, asbestos fibers, cellulosic fibers, carbon fibers, synthetic fibers such as polytetrafluoroethylene fibers, metal fibers, as well as other filler materials such as mica, talc, calcium silicate, carbon black, kaolin, china clay, silica, metal powders, and the like. A particularly preferred sheet material comprises one of the aforementioned thermoplastic polymers filled with glass fibers and combinations of glass fibers together with one or more of the aforementioned reinforcing fibers and/or additional fillers.

An especially attractive combination of filler materials comprises the combination of glass fibers together with an amount of polytetrafluoroethylene sufficient to retard dripping of the composition. As is well known to those skilled in the art, polytetrafluoroethylene functions as an efficacious drip retardant agent for glass filled polymers.

The glass fibers may comprise any glass fibers well known to those skilled in the art. Suitable glass fibers are widely available commercially and any such glass fibers are suitable for use herein. For sheet materials ultimately to be employed for electrical uses, it is preferred to use fibrous glass filaments comprised of lime-aluminum borosilicate glass that is relatively soda free, known as type "E" glass. Other types of glass fibers may also be employed where electrical properties are not so critical, for example type "C" glass fibers.

The glass fibers are made by standard processes, such as by steam, air blowing, flame blowing, and mechanical pulling. Typically, the glass fibers will have a diameter of from about 0.00012 to 0.00075 inches, and a length of from about 1/16 to about 2 inches long. The glass fibers may also be bundled into tows and fine yarns which are capable of migrating through the polymeric component of the sheet. The exact length and thickness of the glass fibers, however, is not critical to the present invention.

Milled glass and glass spheres may also be employed.

The instant sheet materials may also contain other desirable additives such as dyes, pigments, lubricants such as long chain aliphatic waxes, thixotropic agents, plasticizers, flame retardants, antioxidants, and drip retardants. A particularly preferred sheet material comprises one of the aforementioned thermoplastic polymers, from about 5 to 60%, preferably from 20 to 45% by weight of glass fibers, and a flame retardant amount of a suitable flame retardant. The sheet materials of the present invention may also contain an impact modifier such as an elastomer, an acrylic polymer such as polymethylmethacrylate, or a polycarbonate polymer.

Any suitable flame retardant well known to those skilled in the art may be employed in the present invention. Synergistic combinations of flame retardants, such as are well known to those skilled in the art, are particularly preferred. Examples of suitable flame retardants include combinations of aromatic halides and Group Vb elements of the Periodic Table of the Elements such as phosphorous, arsenic, antimony and bismuth; and halogenated aromatic carbonate polymers and combinations thereof with antimony compounds such as are described in U.S. Pat. No. 4,124,561, the entirety of which is herein incorporated by reference. Particularly preferred flame retardants comprise the flame retardants disclosed in Gall, U.S. Pat. No. 3,873,491, and a combination of decabromobiphenyl ether and antimony trioxide, with the latter combination being most preferred. The antimony trioxide and decabromobiphenyl ether flame retardant combination will usually be used in an amount sufficient to provide from about 2 to 10% by weight antimony trioxide, and from about 3 to 15% by weight of decabromobiphenyl ether. If one of the aforementioned halogenated polycarbonate polymers is employed as the flame retardant agent, the sheet material will usually contain from about 10 to 50% by weight of the polycarbonate polymer. Synergistic combinations of halogenated polycarbonate, antimony trioxide, and decabromobiphenyl ether are also highly preferred.

In the preparation of polyalkylene terephthalate sheet, the polyalkylene terephthalate polymer itself may also be fire retardant. For example, a fire retardant brominated copolyester comprising polybutylene terephthalate modified with ethoxylated tetrabromo bisphenol A can be employed. The advantage of this type of polymer is that the necessity of a separate fire retardant agent is obviated and "blooming" is thereby eliminated.

A highly significant feature of the sheet materials of the present invention is that they have a polymer-rich surface. As has been aforementioned, as a result of this unique feature, the instant sheet materials have the physical properties of a filled thermoplastic polymer sheet, and at the same time possess a surface appearance almost as good as that of a non-filled thermoplastic polymer sheet. The presence of a polymer-rich surface also provides the sheet materials of the present invention with an improved dielectric strength, as compared with molded specimens of the same thickness. As used herein, the term "polymer-rich surface" means that the sheet materials of the present invention have a surface which is substantially free of exposed filler materials, such as glass fibers, and comprises substantially a layer of non-filled thermoplastic polymer. Sheet materials having such a surface will exhibit a gloss value of at least 15, preferably at least 30, and most preferably at least 50, as measured by ASTM method E97 at a measurement angle of 45°, using a Gardner Multi-Angle Glossmeter Model 66-9095. A poly(1,4-butylene terephthalate) sheet containing 31% by weight glass fibers and having such a surface is illustrated in FIG. 5.

As a further consequence of the unique polymer-rich surface of the instant sheet materials, as well as the novel process employed for making these materials, the instant extruded sheet materials also exhibit a surface roughness of less than 150 microinches, preferably less than 100 microinches, and most preferably less than 50 inches, measured at the center of the sheet in accordance with American Standard Surface Texture method ASA B46.1-1962 using a Brush Surfindicator ® smoothness meter available from the Guild Company, standard ASA electroformed metal standards, and a stylus arm velocity of a constant $\frac{1}{8}$ inch per second. As the foregoing standard test methods and apparatus are well known to those skilled in the art, a further description thereof is deleted in the interest of brevity.

The novel sheet materials of the present invention will typically have a thickness of from about 0.01 to about 0.125 inches, preferably 0.04 to 0.07 inches, and will include what is conventionally termed both sheet and film. The instant sheet materials may also be employed in any application for which a filled, extruded thermoplastic sheet material having a good surface appearance may be desired. Due to their excellent physical properties, including improved dielectric strength and good surface appearance, a particularly advantageous use of the instant sheet materials is in electrical applications as substrates for printed circuit boards, electrical supporting boards, potentiometers, and foil switches.

Particularly preferred sheet materials in accordance with the present invention comprise a crystalline thermoplastic polymer and a reinforcing filler material such as glass fibers. Such sheet materials have a unique combination of physical properties highly suitable for use in electrical applications. As used herein, the term "crystalline thermoplastic polymers" refers to those thermoplastic polymers which are capable of forming solid crystals having a definite geometric form. Examples of suitable crystalline thermoplastic polymers include the polyolefins such as polyethylene, polypropylene and copolymers thereof; polyphenylene oxide polymers; polyoxymethylene homopolymers and copolymers; polyamides such as polyhexamethylene adipamide, polyhexamethylene sebacimide, polycaprolactam, polyhexamethylene laurinamide, poly(1,2-aminolauric acid), and poly(1,1-aminoudecanoic acid); and polyesters such as polyethylene terephthalate, polypropylene terephthalate, and polybutylene terephthalate. In a preferred embodiment the crystalline thermoplastic polymers preferably employed in the instant sheet materials comprise polyhexamethylene adipamide; an acetal copolymer formed from formaldehyde and ethylene oxide or 1,3-dioxolane; polyethylene terephthalate; polybutylene terephthalate; blends of polyethylene terephthalate and polybutylene terephthalate; and blends of polyethylene terephthalate or polybutylene terephthalate with polycarbonates.

The foregoing crystalline thermoplastic polymers are well known to those skilled in the art and are widely available commercially. Polyhexamethylene adipamide, for example, is readily available commercially as nylon 6/6. Similarly, the above-described preferred acetal copolymer can be obtained commercially under the trade designation Celcon from the Celanese Plastic Materials Company, or can be manufactured by the method described in Walling et al., U.S. Pat. No. 3,027,352, the entirety of which is herein incorporated by reference. Preferred polyhexamethylene adipamide polymers and acetal copolymers are those having a relative viscosity of between about 50 and about 300, and a weight average molecular weight of about 18,000 and about 50,000, respectively.

Figure 3A:
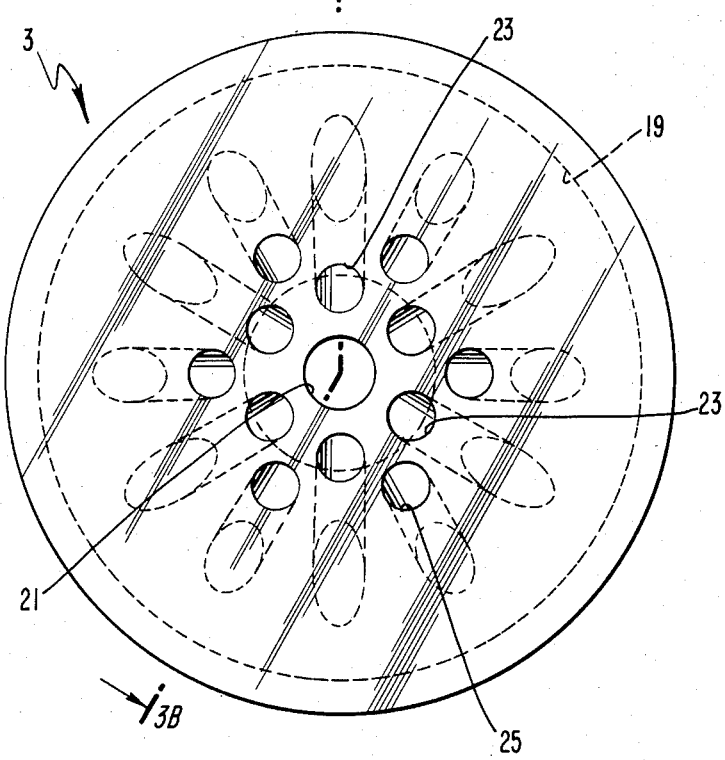
FIG. 3A is an enlarged end view of the breaker plate employed in the apparatus of FIG. 1.
Figure 3B:
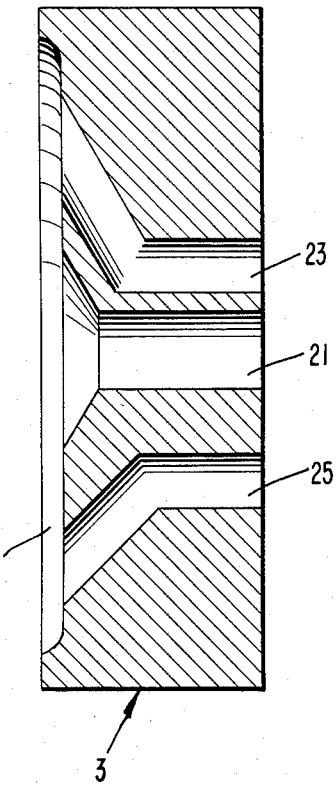
FIG. 3B is a sectional view along line 2B of the breaker plate of FIG. 3A.

Due to its unique combination of heat resistance, e.g., U.L. recognized Class B status (130° C.), heat distortion temperature, high flexural modulus, low flammability, and its non-dripping and non-igniting character, which renders it ideally suited for use in the manufacture of printed circuit boards, glass-fiber reinforced polyalkylene terephthalate comprises the most preferred polymer for use in the present sheet materials. Suitable polyalkyl- As seen in FIGS. 3–5, the breaker plate 3 comprises a plurality of spaced series of ports which converge towards the mouth of the sheet die 5. In the embodiment of FIGS. 3A and B, the breaker plate 3 has a central longitudinal passage 21 with a converging, funnel shaped neck, and circumferentially spaced therearound a first set of 6 spaced converging ports 23, and disposed therearound a second set of 6 spaced converging ports 25. The breaker plate 3 is also provided with a milled feed ring 19, which faces the screw 1.

The exact size, number, and spacing of the ports in the breaker plate 3 is not critical and can be varied to achieve the desired pattern of flow, as illustrated in FIGS. 4 and 5. In FIGS. 4A and B, a third set of 12 spaced converging ports 35 is circumscribed about a port arrangement identical to that illustrated in FIGS. 3A and B, comprising a central longitudinal passage 29, a first set of 6 spaced converging ports 31, and a second set of 6 spaced converging ports 33. Feed ring 27 is also provided to convey thermoplastic to each of the aforementioned ports from screw 1. In FIGS. 5A and B, the breaker plate 3 comprises feed ring 37, central longitudinal passage 39, a first set of 12 circumjacent converging ports 43, and a second set of 12 circumjacent converging ports 45 disposed about the ports 43.

Each of the above-described breaker plates creates a pressure drop in the system and converts the stream of thermoplastic polymer emerging from screw 1 from a corkscrew-like flow to a substantially oriented flow by converging the flow of thermoplastic polymer at the mouth of the die 5. As a result a more uniform pressure is maintained in the sheet die and pressure variations are avoided therein, leading to a filled extruded sheet material having an outstanding surface appearance.

While a breaker plate having a plurality of straight, non-converging ports therein may be utilized to create a pressure drop and orient the flow of thermoplastic polymer, best results are obtained using the breaker plates of the instant invention. Due to the novel structure of the instant breaker plates, a large pressure drop and concomitantly a greater pressure stabilization can be attained therewith than with a breaker plate having straight, non-converging ports therein.

During the extrusion of thermoplastic polymer, a high pressure, high shear zone is created around the perimeter of the screw 1 and a low pressure zone is created at the tip of the screw 1. A larger pressure drop can thus be created by withdrawing polymer from the low pressure zone at the tip of the screw 1 than by withdrawing polymer from the high pressure zone around the perimeter of the screw. Due to the high pressures involved in the extrusion process, it is desirable that some ports be provided in the high pressure area around the perimeter of the breaker plate.

In the breaker plates of the present invention, therefore, each of the breaker plates illustrated in FIGS. 3–5 is provided with a relatively large central port, through which a substantial portion of the polymer melt stream is withdrawn under relatively lower pressure and shear conditions. In addition, each of the surrounding ports, such as the ports 23 and 25 of the breaker plate shown in FIG. 3, converge towards the mouth of the sheet die 5. By converging the circumjacent ports, such as the ports 23 and 25, the polymer melt stream flowing through the ports 23 and 25 has a longer path of travel than the polymer flowing through the central port 21. As a result of these features, a greater pressure drop and stabilization, leading to a more stable flow of polymer, is attained.

Not only is pressure stabilization important to producing a stable flow of thermoplastic polymer, but by feeding the melt stream through the breaker plate under controlled pressure conditions, less degradation of the thermoplastic polymer itself occurs, which further contributes to enhanced sheet properties and appearance. It is also to be noted that greater temperature uniformity is present towards the center of the breaker plate, and by converging the ports through the breaker plate, the thermoplastic polymer is fed through the breaker plate under more uniform temperature conditions which likewise reduces polymer degradation.

A further and highly significant advantage of the foregoing breaker plates is that they gradually converge the flow of the molten polymer so that the filler material present therein is aligned in the direction of extrusion and does not back up. With a breaker plate being straight ports therein, the filler material, such as glass fibers, has a tendency to back up, creating surging in the system.

Alignment of the fibers with their longitudinal axes in the direction of extrusion also accrues a further improvement in surface appearance, and especially smoothness. In addition, it has been discovered that not only does alignment of the filler contribute to improved surface appearance, but filler alignment also enhances the melt strength of the filled thermoplastic polymer, enabling low melt strength polymers such as the polyamides and polyesters to be extruded into sheet much more readily. While not wanting to be bound by any specific theory, it is believed that alignment of the filler material creates a bridge effect between polymer chains, resulting in a sheet material of enhanced melt strength.

While the present invention has been described with reference to the use of a breaker plate, other devices which similarly function may also be employed in place thereof. For example, a static mixer may be used advantageously, either alone or in combination with the breaker plate 3.

The resulting laminar melt stream is thereafter contacted with a hot, highly polished surface under temperature and pressure conditions suitable to form a smooth, glossy polymer-rich surface thereon. As shown in FIG. 1, this hot, highly polished surface preferably comprises a pressure roll system, indicated generally at 9. An electrostatic pinner may also be employed, however, if desired. The pressure roll system 9 will generally contain a sufficient number of rolls, and be maintained under conditions of sufficient temperature and pressure to form the aforementioned polymer-rich surface on the sheet. Best results are obtained using a pressure roll system having a mirror-bright chrome finish on the rolls thereof. The pressure roll system 9 is also preferably juxtaposed as close as possible to the lip of the sheet die 5, in order to minimize cooling of the sheet and the premature setting-up thereof.

The pressure roll system 9 will generally contain at least 2 nips. Enhanced results are obtained, particularly with sheets of crystalline polymers such as poly(1,4-butylene terephthalate) by employing a vertical stack of at least three highly polished rolls, illustrated in FIG. 1 as comprising the rolls 11, 12, and 13. The advantage of such an arrangement is that it permits an extremely close juxtaposition of the heated rolls, which is highly ene terephthalate polymers for use in the present invention comprise polyethylene terephthalate and polybutylene terephthalate homopolymers, copolymers, mixtures thereof, and mixtures thereof with minor amounts of other thermoplastic polymers, such as have been described above. Particularly advantageous polybutylene terephthalate polymers comprise homopolymers of polybutylene terepthalate. Such polymers are well known to those skilled in the art and can be produced from the reaction product of terephthalic acid or a dialkyl ester of terephthalic acid (especially dimethyl terephthalate) and diols having 4 carbon atoms. Suitable diols include 1,4-butanediol, 1,3-butanediol, 1,2-butanediol, and 2,3-butanediol, of which 1,4-butanediol is most preferred. The manufacture of these polymers and highly desirable compositions containing the same are described in U.S. Pat. Nos. 3,801,530; 3,764,576; 3,814,725; 3,873,491; and 3,903,042, the entirety of which are herein incorporated by reference.

Extruded sheets having highly desirable physical properties will comprise one of the aforementioned polymers in combination with from about 5 to 60% by weight, preferably 20 to 45% by weight glass fibers, and optionally from 1 to 12% by weight of antimony trioxide, 3 to 15% by weight of decabromobiphenylether, and other optional desirable additives and fillers, such as have been described above.

A particularly preferred circuit board substrate in accordance with the present invention comprises an extruded sheet material of poly(1,4-butylene terephthalate) containing from about 5 to 45% by weight glass fibers, preferably 20 to 45% by weight glass fibers, from about 1 to 12% by weight antimony oxide, from about 3 to 15% by weight decabromobiphenyl ether, and from 1 to about 50% by weight asbestos fibers, and having further a polymer-rich surface, a gloss value of at least 15, preferably 30, and most preferably 50, and a surface roughness of less than 150 microinches, preferably less than 100 microinches, and most preferably less than 50 microinches. In substitution for, or in addition to the asbestos fibers, the sheet material may also contain from about 0.05 to about 15% or more by weight of a polytetrafluoroethylene filler material.

Preferred poly(1,4-butylene terephthalate)polymers for use in the above-described circuit board substrate comprise polymers having an intrinsic viscosity of from about 0.2 to 2.0 deciliters/gram, as measured in a 60:40 mixture of phenol and 1,2-orthodichlorobenzene at 25° C. Due to their relatively low cost, poly(1,4-butylene terephthalate)polymers having an intrinsic viscosity of from about 0.65 to about 0.75 deciliters/gram are especially preferred.

In a further embodiment, the present invention also provides a process and apparatus for use in the preparation of the above-described novel sheet materials. This method comprises melt extruding an admixture of one of the aforementioned thermoplastic polymers, such as for example, poly(1,4-butylene terephthalate), together with one or more of the above-described fillers, preferably glass fibers, into a continuous laminar melt stream. The resultant laminar melt stream is then conveyed and contacted with a hot, highly polished surface at a temperature of from about 200° F., preferably from about 250° F., up to the temperature at which the polymer sticks to the hot, highly polished surface and at a pressure sufficient to cause the filler material to retreat from the surface and to form a sheet having a smooth, glossy, polymer-rich surface.

In the preferred embodiment of the present process, further improvements in surface appearance as well as in melt strength can be obtained by extruding the filled molten polymer into a sheet under conditions in which the filled polymer is fed to the sheet die such that it has a substantially oriented flow in the direction of extrusion and a reduced axial-rotational flow. Sheet having further improved surface appearance can be obtained by employing a pressure roll system as the hot, highly polished surface, and then passing the filled polymer through the nip thereof under conditions such that a melt reservoir of filled thermoplastic polymer is maintained upstream from the nip but in the approximate location thereof.

Referring to the drawings, FIG. 1 illustrates the preferred process and apparatus for producing the sheet materials of the instant invention. For the sake of explanation the process illustrated therein will be described with reference to the production of a glass fiber-filled poly(1,4-butylene terephthalate) sheet material, although it is to be emphasized that the process of the present invention is equally advantageous for use in producing outstanding sheet materials from any of the thermoplastic materials which have been described above or any other thermoplastic materials such as would be obvious to those skilled in the art.

Referring to FIG. 1, a molten admixture of polybutylene terephthalate and glass fibers is extruded by a conventional screw extruder 1, which may comprise a vented screw extruder. As the stream of molten polymer leaves the extruder 1, it has a component of flow in the direction of extrusion and an axial-rotational component of flow, i.e., a cork screw-like flow. The stream of glass-filled polybutylene terephthalate is then conveyed to chrome plated sheet die 5, preferably a coat hanger type sheet die, wherein it is converted into a continuous laminar melt stream having an irregular surface.

The exact conditions of extrusion are not extremely critical and will vary depending upon the particular thermoplastic polymer being extruded and the particular extrusion apparatus being employed. For a 1¾ inch screw extruder having a compression ratio of 2.9 to 1, the thermoplastic polymer will typically be extruded at a temperature of about 460°–520° F., a screw RPM of from 60–95, a head pressure of from about 300–500 p.s.i.g., a through-put of 7–10 feet/minute, a guage thickness of from about 0.01 to 0.125 inches, preferably 0.04 to 0.07 inches, and an extrusion rate of from 60 to 110 lbs/hr, and preferably about 90 lbs/hr. It is essential, however, that a uniform pressure be maintained in the sheet die and that pressure variations across the die be avoided. Best results are also obtained by employing a long land die having a land length of from about 0.25 to 4 inches, and typically about 2 inches.

In the preferred embodiment, it has been discovered that further improvements in sheet appearance can be obtained by feeding the stream of thermoplastic polymer, such as poly(1,4-butylene terephthalate), to sheet die 5 under conditions in which, at the time of entry into the mouth of the die 5, the stream has a substantially oriented flow in the direction of extrusion. While any method well known to those skilled in the art may be employed to achieve this type of flow pattern, in the embodiment of FIG. 1, a breaker plate 3 is interposed between the screw extruder 1 and the mouth of the sheet die 5.

advantageous in the processing of sheets of crystalline polymers such as polybutylene terephthalate.

The rolls 11, 12, and 13 are maintained under temperature and pressure conditions sufficient to produce a glossy smooth polymer-rich surface on the sheet material, and preferably sufficient to produce a polymer-rich surface having a gloss value of at least 15, preferably at least 30, and most preferably at least 50 and a surface roughness of less than 150 microinches, preferably less than 100 microinches, and most preferably less than 50 microinches. Typically, the temperature of the rolls will range from about 200° F. up to the temperature at which the thermoplastic polymer sticks to the rolls. Best results are obtained by employing rolls as hot as possible, with temperatures of from about 250° F. up to the sticking temperature of the polymer being especially preferred. For crystalline thermoplastic polymers such as polybutylene terephthalate, the temperature of the rolls will generally range from about 200° F., and preferably from about 250° F., up to the melting point of the polymer.

The temperature of the rolls may also be the same, or may decrease gradually from the upper to the lower roll in order to achieve a gradual cooling of the sheet as it passes through the pressure roll system 9. For sheets of crystalline polymers such as polybutylene terephthalate, this latter method is particularly preferred. As has been discussed above, in addition to causing the filler material to retreat into the interior of the sheet, the heat and pressure of the rolls 11, 12, and 13 also apparently assists in the setting up of low melt strength crystalline polymers such as poly(1,4-butylene terephthalate), enabling these type of polymers to be successfully extruded into a stable, non-fluid sheet material.

The rolls 11, 12, and 13 may be heated by any method well known to those skilled in the art, such as for example by steam, oil, or electrically. A holding pressure of about 50 to 70 lbs. will also generally be maintained between the rollers. The nip gap will vary according to the particular polymer being processed. Best results are also obtained by adjusting the speed of the rolls to correspond to that of the extruder so as to avoid any lineal tension on the sheet and to minimize differential shrinkage.

Following passage through the pressure roll system 9, the treated sheet material is passed through a plurality of straightening rolls 15 to straighten the same. Take-off rolls 17 thereafter remove the finished sheet material to storage, etc. Preferably, the speed of the extruder, the rolls 11, 12, and 13, the rolls 15, and take-off rolls 17 are synchronized to avoid lineal tension on the sheet material.

Figure 2:
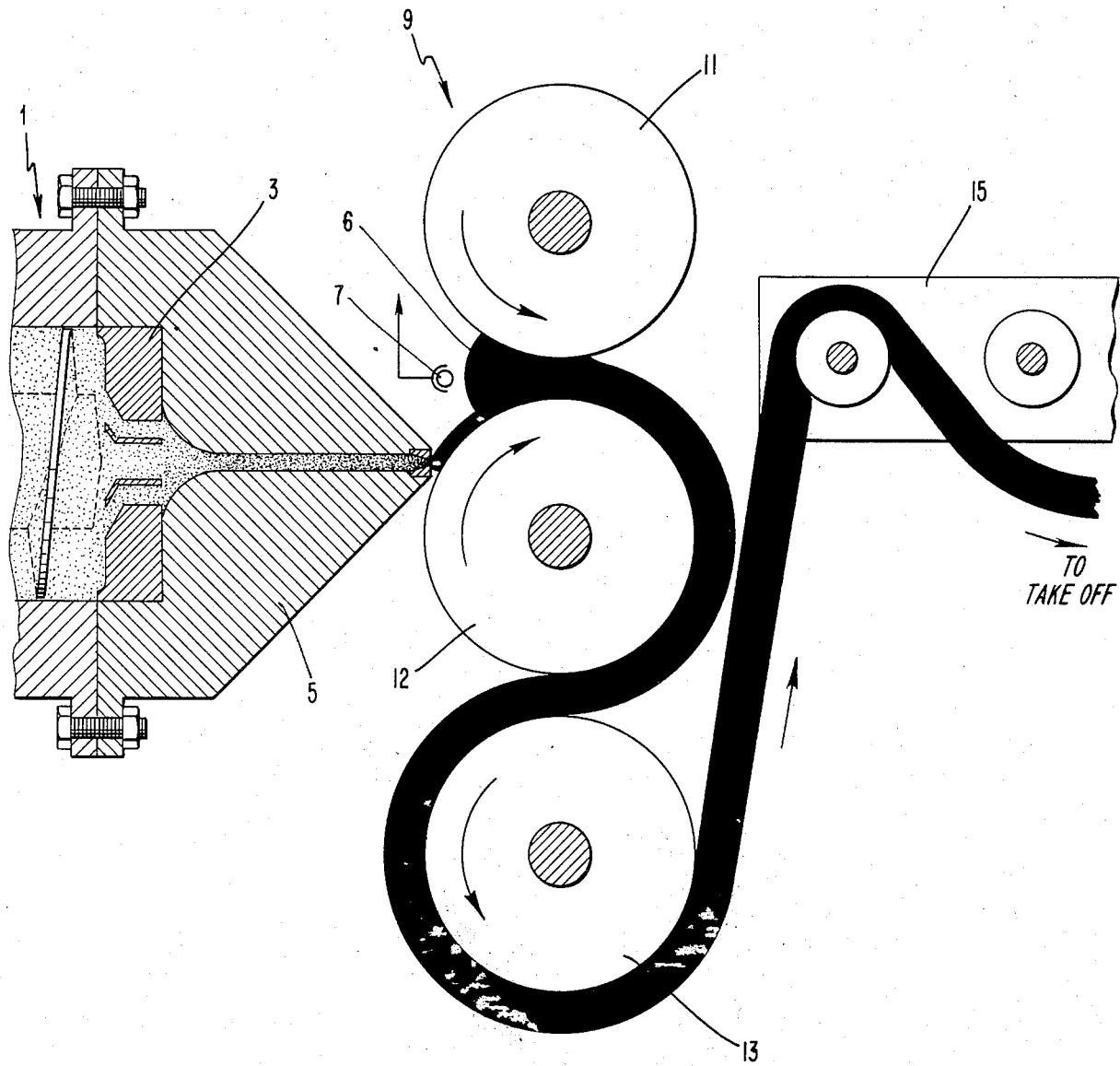
FIG. 2 is a schematic flow diagram, in section, of a preferred method for producing the extruded filled sheet materials of the present invention.

FIG. 2 illustrates a preferred method for preparing the sheet materials of the present invention. In the embodiment of FIG. 2, a continuous, oriented laminar melt stream is introduced onto the roll 12 slightly upstream from the nip formed between rolls 11 and 12, and is passed through the nip under conditions such that a melt reservoir 6 of molten thermoplastic polymer is maintained slightly upstream, but in the approximate vicinity of the nip. During start-up, the rolls 11–13 and take-off rolls 15 are run slightly slower than the extruder 1, the result of which is the creation of the melt reservoir 6. The rates of the extruder 1, the rolls 11–13, and the take-off rolls 15 are then synchronized to maintain the melt reservoir at the desired size. Optical sensor 7, preferably interconnected via a microprocessor to the drives for the extruder 1, the rolls 11–13, and the take-off rolls 15, is preferably employed to assist the synchronization thereof and to maintain the melt reservoir 6 constant at its desired value.

It has been found that the size of the melt reservoir 6 is relatively important to sheet surface appearance, and can be neither too small nor too thick for optimum surface appearance. The exact size of the melt reservoir 6 necessary for optimum sheet appearance will vary according to the particular composition being processed, the thickness of the desired sheet material, etc., and can readily be determined by those skilled in the art by empirical testing.

By operating in the above-described manner, further improvements in sheet appearance are obtained as compared with a rolling-type operation such as is illustrated in FIG. 1.

In order to more fully describe the present invention, the following examples are presented which are intended to be merely illustrative and not in any sense limitative of the invention.

EXAMPLE I

A poly(1,4-butylene terephthalate) polymer, having an intrinsic viscosity of 0.72 deciliters/gram and containing about 31% by weight of 3/16 inch long Owens Corning K419 AA glass fibers, 4.85% by weight antimony trioxide, 4.85% by weight decabromobiphenyl ether, and 2.6% by weight asbestos fiber, is extruded into a sheet utilizing a 1¾ inch diameter, non-vented screw having a compression ratio of 2.9 to 1 and an RPM of 60; and a chrome-plated, long land, 8 inch wide flex lip sheet die having a removable bottom, a land length of 2 inches, and an adjustable 0.03 to 0.06 inch lip. A breaker plate having the configuration illustrated in FIGS. 5A and 5B is also employed. The ports 41 have a diameter of 0.1875 inches and are set at an angle of 30° with respect to the longitudinal axis of the breaker plate. The ports 43 have a 0.125 inch diameter and are set at an angle of 45° with respect to the longitudinal axis.

Prior to processing, the aforementioned material is dried for 3 hours at 275° F. Thereafter, the extrusion profile is set and the extruder is allowed to come to equilibrium by extruding approximately 50 lbs. of polymer therethrough. An oriented laminar melt stream having a thickness of 0.0475 inches is then produced at an extrusion rate of 9 feet/minute, an extrusion temperature of 480° F., a die temperature of 510° F., an RPM of 58, and a head pressure of 800 p.s.i.

The resulting laminar melt stream is then passed through a three roll stack of 10 inch diameter, highly polished, heated chromed rolls, juxtaposed as close as possible to the sheet die. The top roll is pre-gapped to 0.055 inches with a 60 lbs. holding pressure. The temperature of the rolls is maintained with a top roll temperature of 265° F., a middle roll temperature of 255° F., and a bottom roll temperature of 200° F., using Sterco Oil Thermolators. The speed of the rollers is also synchronized with the extrusion rate at 9 feet/minute to produce a melt reservoir of polymer, such as is shown in FIG. 2.

Following passage through a plurality of straightening rolls, the physical properties, surface roughness, and surface gloss of the finished sheet are measured using an 8 inch sample of the sheet. All measurements are made according to standard ASTM procedure, measurement of physical properties being made in the direction of extrusion. The gloss is measured at an angle of 45°, according to ASTM E97, using a Gardner Multi-Angle Glossmeter Model 66-9095 and standard highly polished metal standards as called for in this test method. The surface roughness is measured at the center of each 8-inch sheet sample according to American Standard Surface Texture method ASA B46.1-1962, using a Brush Surfindicator® smoothness meter and ASA electroformed metal standards. The stylus of the above instrument is moved across the sample at a constant ⅛ inch/second. The results of these determinations are set forth below.

| | |
|---|---|
| Tensile Strength (psi) | 13,300 |
| Tensile Elongation (%) | 0.97 |
| Tensile Modulus ($\times 10^6$) | 1.66 |
| Flexural Modulus ($\times 10^6$) | 1.80 |
| Flexural strength at at Break (psi) | 25,300 |
| Gardner Impact (in. lb.) | <2.5 |
| Dielectric Strength (volts/mil.) | 650 |
| Gloss | 16.5 (top surface) |
| Roughness (microinches) | 60 |

The foregoing sheet is also examined under a microscope to examine the regularity of the sheet surface, and the alignment of the glass fibers therein. FIG. 5 is a photograph of an enlarged view, with a magnification power of 500×, of the sheet surface. FIG. 6 is a photograph of an enlarged view, with a magnification power of 200×, of a vertical section along a plane normal to the direction of extrusion of the foregoing sheet following fracture to expose the glass fibers. As seen in FIG. 5, and as corroborated by the foregoing gloss and smoothness measurements, the poly(1,4-butylene terephthalate) sheet material produced in this experiment possesses a very smooth, glossy, polymer-rich surface with very few glass fibers visible on the surface thereof. FIG. 6 also illustrates the substantial longitudinal alignment of the glass fibers in the sheet, which further contributes to the excellent surface appearance and melt strength thereof. Moreover, as the foregoing data demonstrates, this sheet possesses outstanding physical properties. In fact, it has been discovered that due to its polymer-rich surface, the instant sheet material exhibits a significantly improved dielectric strength as compared with conventional thermoplastic sheet materials, a feature highly advantageous for electrical utilities.

By way of comparison, the foregoing experiment is repeated using a conventional process for extruding sheet, i.e., without the breaker plate and heat and pressure treatment of the present invention. The resulting sheet is found to be so fluid and uneven and to have such a low melt strength that it is impossible to make physical determinations thereon.

EXAMPLE II

Utilizing the apparatus and procedure of Example I, a poly(1,4-butylene terephthalate) polymer having an intrinsic viscosity of 0.72 deciliters/gram and containing about 30% by weight of 3/16 inch long Owens Corning K419AA glass fibers is extruded into a continuous sheet having a thickness of 0.060–0.065 inches. The resulting sheet is found to have a highly desirable surface appearance and smoothness.

EXAMPLE III

Similar to the procedure of Example I, an extruded sheet material having a thickness of 0.060 to 0.065 inches is prepared from a filled poly(1,4-butylene terephthalate) composition. This composition compared 55.5% by weight of the polybutylene terephthalate polymer of Example I, 51% by weight of which was in chip form prior to formulation, and 4.5% by weight of which was in powder form; 31% by weight of Owens Corning 3/16 inch K419AA glass fibers; 5.5% by weight of $Sb_2O_3$; 5.5% by weight of decabromobiphenyl ether; 0.5% by weight of Dupont Teflon K polytetrafluoroethylene fibers; and 2% by weight of Union Carbide Phenoxy PKHH, a thixotropic agent prepared by reacting bisphenol A and epichlorohydrin.

After preparation, the surface gloss and surface appearance of the resulting sheet material are determined, and are found to be highly suitable for commercial use.

The foreoing examples clearly demonstrates the novel and unique sheet materials which can be produced by the present invention. In addition to the significant improvements in surface appearance and dielectric strength which are accrued by forming a polymer-rich surface thereon, the foregoing examples also demonstrate the salutary effect which the heat and pressure treatment and enhanced melt strength has on the resulting sheets, enabling non-soupy stable sheet materials to be produced from such difficultly extrudable polymer as poly(1,4-butylene terephthalate). Accordingly, the present invention provides a much needed contribution to the extruded, filled thermoplastic sheet art.

While the present invention has now been described in terms of various preferred embodiments, and illustrated by numerous examples, the skilled artisan will readily appreciate that various modifications, substitutions, omissions, and changes may be made without departing from the spirit thereof. Accordingly, it is intended that the scope of the present invention be defined by the following claims.

What is claimed is:

1. An extruded, filled thermoplastic sheet material, comprising a crystalline thermoplastic polymer selected from the group consisting of polyolefins; polyoxymethylene homopolymers and copolymers; polyphenylene oxide polymers; polyamides; polyesters; mixtures thereof; and mixtures thereof with minor amounts of other thermoplastic polymers; containing from about 5 to 60 percent by weight of a reinforcing filler material, the reinforcing filler consisting essentially of fibrous materials, and having a polymer-rich surface which is substantially free of exposed reinforcing filler material and comprises substantially a layer of non-filled thermoplastic polymer; said surface having a gloss value of at least about 15, and a maximum surface roughness of about 150 microinches.

2. The sheet material of claim 1, wherein the filler material of said sheet is substantially aligned.

3. The sheet material of claims 1 or 2, wherein said reinforcing filler material consists of glass fibers.

4. The sheet material of claims 1 or 2, wherein said sheet material has a gloss value of at least about 30, and a maximum surface roughness of about 100 microinches.

5. The sheet material of claim 2, wherein said thermoplastic polymer further comprises a flame retardant amount of a flame retardant agent.

6. The sheet material of claims 1 or 2, wherein said thermoplastic polymer is selected from the group consisting of hexamethylene adipamide; a polyoxymethylene polymer or copolymer; polyalkylene terephthalate polymers and copolymers; mixtures of polyalkylene terephthalate polymers and copolymers; and mixtures of polyalkylene terephthalate polymers with minor amounts of other thermoplastic polymers.

7. The sheet material of claim 6 wherein said thermoplastic polymer further comprises a flame retardant amount of a flame retardant agent.

8. An extruded, glass-filled polyalkylene terephthalate continuous sheet material comprising a polyalkylene terephthalate polymer, mixtures of polyalkylene terephthalate polymers; and mixtures of polyalkylene terephthalate polymers; with minor amounts of other thermoplastic polymers; from about 5 to 60 percent by weight of glass fibers; essentially no particulate reinforcing material; and having a surface which is substantially free of exposed reinforcing filler material and comprises substantially a layer of non-filled thermoplastic polymer; said surface having a gloss value of at least 15, and a maximum roughness of about 150 microinches.

9. The sheet material of claim 8, wherein said sheet material has a gloss value of at least about 30, and a maximum surface roughness of about 100 microinches.

10. The sheet material of claim 8, wherein said polyalkylene terephthalate is selected from the group consisting of polyethylene terephthalate, poly(1,4-butylene terephthalate), mixtures of polyethylene terephthalate and poly(1,4-butylene terephthalate), and mixtures thereof with minor amounts of other thermoplastic polymers.

11. The sheet material of claim 8, wherein said polyalkylene terephthalate polymer comprises poly(1,4-butylene terephthalate).

12. The sheet material of claim 8, wherein said polyalkylene terephthalate polymer comprises a brominated polybutylene terephthalate polymer.

13. The sheet material of claim 8, wherein said sheet material comprises a lower melt strength homopolymer of poly(1,4-butulene terephthalate) having an intrinsic viscosity of from about 0.65 to 0.75 deciliters/gram containing from about 20 to about 45 percent by weight of glass fibers and a flame retardant amount of a flame retardant agent.

14. The sheet material of claim 13, wherein said sheet material further comprises a drip retarding amount of a polytetrafluroethylene drip retarding agent.

15. The sheet material of claim 8, wherein the glass fibers are substantially aligned in said sheet.

* * * * *